United States Patent
Tanaka

(10) Patent No.: US 8,108,752 B2
(45) Date of Patent: Jan. 31, 2012

(54) ERROR CORRECTING DEVICE, METHOD, AND PROGRAM

(75) Inventor: Keisuke Tanaka, Machida (JP)

(73) Assignee: International Business Machines Corporation, Armonk, NY (US)

( * ) Notice: Subject to any disclaimer, the term of this patent is extended or adjusted under 35 U.S.C. 154(b) by 1091 days.

(21) Appl. No.: 11/999,446

(22) Filed: Dec. 4, 2007

(65) Prior Publication Data

US 2008/0155374 A1    Jun. 26, 2008

Related U.S. Application Data

(63) Continuation of application No. PCT/JP2006/311553, filed on Jun. 8, 2006.

(30) Foreign Application Priority Data

Jun. 10, 2005 (JP) ................... 2005-170324

(51) Int. Cl.
*H03M 13/00* (2006.01)
(52) U.S. Cl. .................. 714/755; 714/752; 714/758
(58) Field of Classification Search .................. 714/752, 714/755, 758, 766
See application file for complete search history.

(56) References Cited

U.S. PATENT DOCUMENTS

| 5,276,674 A | 1/1994 | Tanaka |
| 7,284,183 B2 * | 10/2007 | Wu et al. ............... 714/758 |
| 7,478,306 B2 * | 1/2009 | Okamoto et al. ........... 714/758 |
| 2002/0038443 A1 | 3/2002 | Iwata |
| 2002/0159368 A1 * | 10/2002 | Noda et al. ............. 369/59.25 |
| 2004/0039769 A1 | 2/2004 | Orio |
| 2005/0144550 A1 * | 6/2005 | Jeon et al. ............... 714/755 |

FOREIGN PATENT DOCUMENTS

| JP | 05-012814 | 1/1993 |
| JP | 08-007496 | 1/1996 |
| JP | 2004-07105 1 A | 11/1997 |
| JP | 11-203615 | 7/1999 |
| JP | 11-203797 | 7/1999 |
| JP | 11-2383204 | 8/1999 |
| JP | 2000-113607 | 4/2000 |
| JP | 9293331 A | 3/2004 |
| JP | 2004-281043 | 10/2004 |

* cited by examiner

*Primary Examiner* — Sam Rizk
(74) *Attorney, Agent, or Firm* — GSS Law Group

(57) ABSTRACT

A device, method, and program are provided to prevent an increase of the probability of erroneous correction for a burst error having a length exceeding detection capability even if high correction capability is selected for a random error. In one embodiment, an apparatus corrects errors in a product code block including C1 codes in a row direction and C2 codes in a column direction. First, a C1 decoder performs C1 correction for each of an even C1 including even-numbered bytes in the C1 code and an odd C1 including odd-numbered bytes in the C1 code. Next, a C2 decoder performs erasure correction in C2 correction in the case where any one of the C1 correction results for the even C1 and the odd C1 is correction failure, and where one of the results is the 3-byte correction while the other one is the correction failure or the 3-byte correction.

20 Claims, 9 Drawing Sheets

| RESULT OF C1 CORRECTION | | WHETHER OR NOT TO PERFORM ERASURE CORRECTION IN C2 CORRECTION | | RATE OF OCCURRENCE |
|---|---|---|---|---|
| EVEN C1 | ODD C1 | EVEN C1 | ODD C1 | |
| 0 TO 2-BYTE CORRECTION | 0 TO 2-BYTE CORRECTION | | | 4.40e-11 |
| 0 TO 2-BYTE CORRECTION | 3-BYTE CORRECTION | | | 8.88e-7 |
| 3-BYTE CORRECTION | 0 TO 2-BYTE CORRECTION | | | 8.88e-7 |
| 0 TO 2-BYTE CORRECTION | CORRECTION FAILURE | | ERASURE CORRECTION | 5.74e-6 |
| CORRECTION FAILURE | 0 TO 2-BYTE CORRECTION | ERASURE CORRECTION | | 5.74e-6 |
| 3-BYTE CORRECTION | 3-BYTE CORRECTION | ERASURE CORRECTION | ERASURE CORRECTION | 1.80e-2 |
| 3-BYTE CORRECTION | CORRECTION FAILURE | ERASURE CORRECTION | ERASURE CORRECTION | 0.116 |
| CORRECTION FAILURE | 3-BYTE CORRECTION | ERASURE CORRECTION | ERASURE CORRECTION | 0.116 |
| CORRECTION FAILURE | CORRECTION FAILURE | ERASURE CORRECTION | ERASURE CORRECTION | 0.750 |

FIG. 6

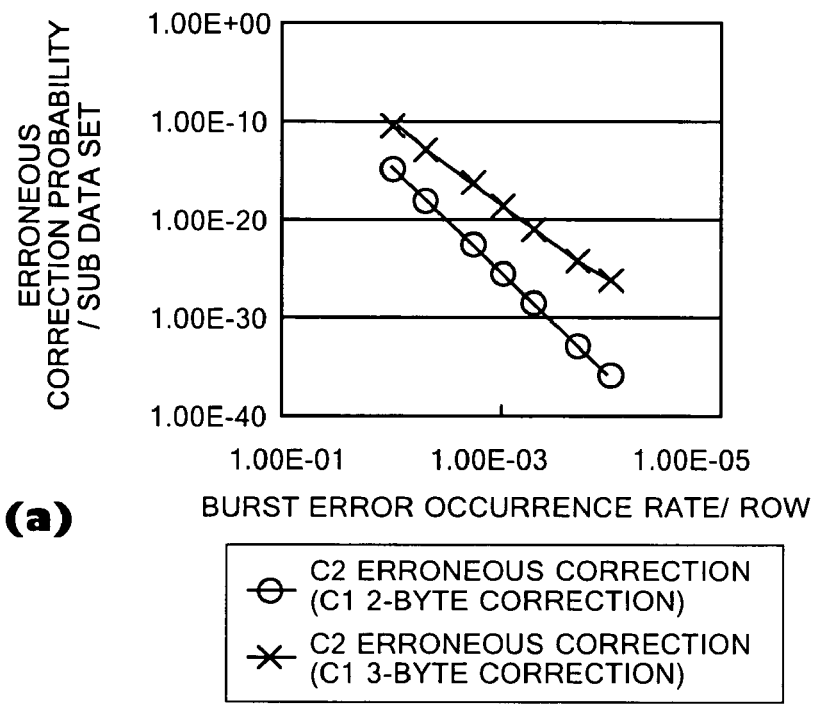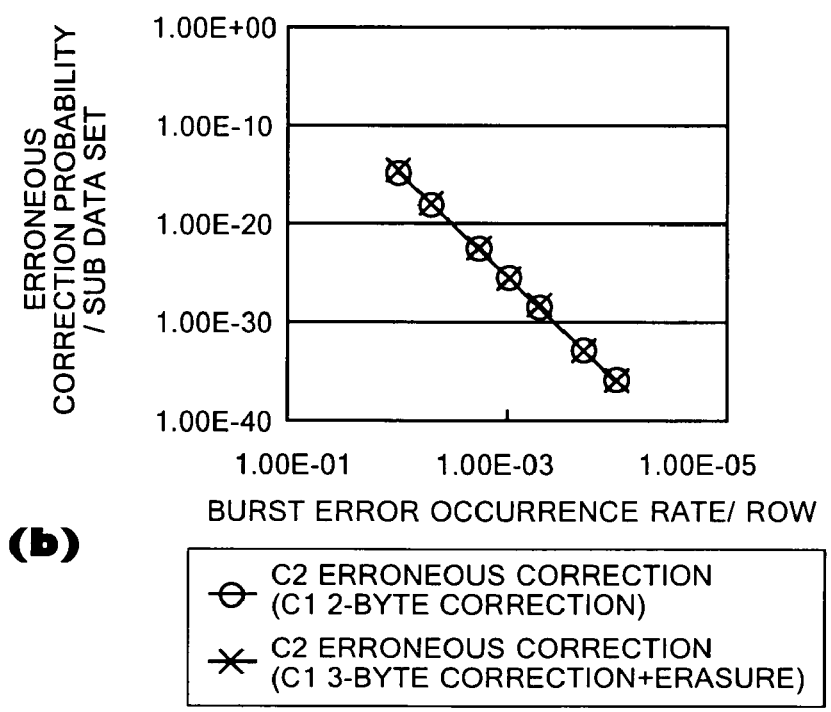
FIG. 8

ERROR CORRECTING DEVICE, METHOD, AND PROGRAM

RELATED APPLICATIONS

This application is a continuation of PCT application number PCT/JP2006/311553, filed on Jun. 8, 2006, which claims benefit of application number 2005-170324, filed in Japan on Jun. 10, 2005.

FIELD OF THE INVENTION

The present invention relates to an apparatus and the like for correcting errors in data read from a recording medium such as a magnetic tape, and more particularly relates to an apparatus and the like for correcting errors in data by use of a product code block.

BACKGROUND

In a data recording and reproducing apparatus for writing and reading data into and from a recording medium, errors are generally detected and corrected in order to prevent the errors from causing a serious problem. Particularly, in recent years, an error correction by use of a product code has been widely performed from the viewpoint of improvement in data reliability and higher data recording density.

Here, the product code can be defined as a matrix code formed by arranging user data in a matrix pattern and arranging parity codes in row and column directions. Moreover, the product code usually includes C1 codes in the row direction and C2 codes in the column direction. The C1 codes include C1 parities which are parity codes for correcting errors in the C1 codes, and the C2 codes include C2 parities which are parity codes for correcting errors in the C2 codes. In such a product code, the errors are actually corrected by performing correction of the C1 codes by use of the C1 parities (C1 correction) and correction of the C2 codes by use of the C2 parities (C2 correction) in this order. By use of this correction method, the rows that cannot be corrected by the C1 correction can be corrected by erasure correction in the C2 correction. Thus, many errors can be corrected.

Note that, as such a correction method for the product code, there have heretofore been proposed many methods (for example, see Patent Documents 1 and 2).

Patent Document 1: Japanese Patent Application Publication No. Hei 11 (1999)-203615 (Pages 5 to 7, FIG. 2)
Patent Document 2: Japanese Patent Application Publication No. Hei 11 (1999)-203797 (Pages 8 and 9, FIG. 2)

SUMMARY

In recent years, a rate of occurrence of random errors had tended to be increased by a larger capacity of the data recording and reproducing apparatus. Such an increase in the rate of occurrence of random errors is generally dealt with by selecting higher C1 correction capability in the product code.

However, the errors that may occur include not only such random errors but also burst errors continuously caused by scratches on the recording medium, problems with a head and the like. In the case where high C1 correction capability is selected in consideration of only the random errors, there is also a problem of an increase of the probability of erroneous correction for a burst error having a length exceeding detection capability.

This problem will be described by taking, as an example, an error correction method in an LTO (Linear Tape-Open) tape drive. Note that the LTO is a tape format standard jointly developed by the following three companies: IBM, Hewlett-Packard Co. and Seagate Technology (currently Quantum).

The error correction code generally enables correction of an error of t bytes that satisfy a relationship $dmin \geq 2t+d+1$ against the minimum Hamming distance dmin, and also enables detection of an error of t+d bytes.

Accordingly, in the conventional error correction method of the LTO tape drive, first, the minimum Hamming distance of the C1 code is set to 7 and assignment of t=2 (2-byte errors are correctable) and d=2 (4-byte errors are detectable) is adopted for enhancing the detection capability. Then, errors of 3 bytes or more are detected or the erasure correction is performed in the C2 correction for the C1 code whose correction has failed.

However, when t=3 (3-byte errors are correctable) is set to enhance the correction capability for the C1 code, d=0 (3-byte errors are detectable) is established. Specifically, compared with the case where 2-byte errors are set to be correctable, the error detection capability is lowered while the error correction capability is enhanced. As a result, an erroneous correction probability is increased. Such an increase in the erroneous correction probability becomes a problem for a burst error that consumes the correction capability for the C2 code. In other words, an increase in the erroneous correction probability for the C1 code is propagated to the C2 code. Accordingly, the erroneous correction probability for the C2 code is also increased. When an erroneous correction occurs in the C2 code, the data is transmitted to a host while the erroneous correction is unrecognized. As a result, a trouble occurs. Since an increase of the probability that a trouble occurs due to the erroneous correction has to be avoided, it is practically problematic to keep selecting 3-byte correction.

Here, the inventions described in Patent Documents 1 and 2 will be examined. Both of the inventions are aimed at a problem that a head runs off tracks and are intended to reduce an erroneous correction probability by reading the same C1 codes on a tape by use of two heads, comparing the C1 codes and adopting, for example, the correctable one. Specifically, no solution is presented for an increase of the probability of an erroneous correction for a burst error when correction capability for random errors is enhanced. After all, there is a problem that the erroneous correction probability for such a burst error cannot be lowered by the inventions described in Patent Documents 1 and 2.

The present invention was made to solve the foregoing technical problems. It is an object of the present invention to prevent an increase of the probability of the erroneous correction for a burst error having a length exceeding detection capability even if high correction capability is selected for a random error.

BRIEF DESCRIPTION OF THE DRAWINGS

FIG. 6 is a view showing correspondences between results of the C1 correction and whether or not to perform erasure correction in C2 correction in the embodiment of the present invention.

FIGS. 8 (a) and 8 (b) are graphs showing that an erroneous correction probability for burst errors is lowered according to the embodiment.

DESCRIPTION OF REFERENCE NUMERALS

Figure 1:
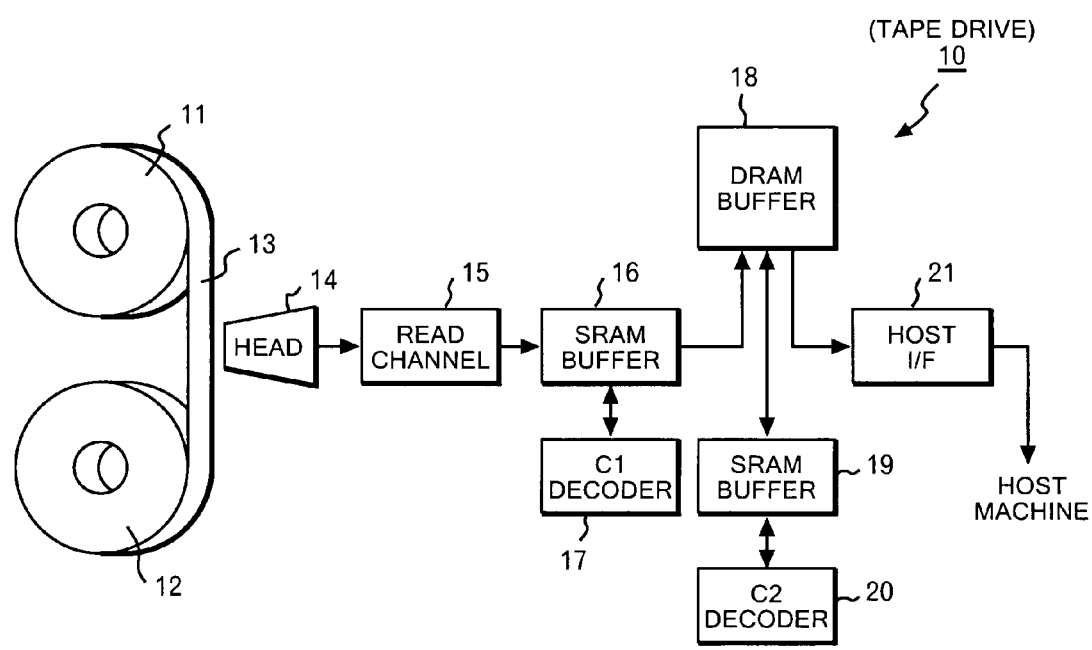
FIG. 1 is a block diagram showing an entire configuration of a tape drive to which an embodiment of the present invention is applied.

10 . . . tape drive
11 and 12 . . . reel1
13 . . . magnetic tape
14 . . . head
15 . . . read channel
16 . . . SRAM buffer
17 . . . C1 decoder
18 . . . DRAM buffer
19 . . . SRAM buffer
20 . . . C2 decoder
21 . . . host I/F

DESCRIPTION

In order to achieve the foregoing object, in the present invention, by referring to both results of first corrections for a pair of two byte strings, a second correction is performed according to degrees of the corrections. Specifically, a first apparatus of the present invention is an apparatus for correcting errors in a product code block including first byte strings in a first direction and second byte strings in a second direction. The apparatus includes: a first decoder which corrects an error in each of a first substring including even-numbered bytes in the first byte string, and a second substring including odd-numbered bytes in the first byte string; and a second decoder which corrects the second byte string according to a combination of a first degree of correction in the first substring and a second degree of correction in the second substring.

Moreover, the present invention can also be seen as an apparatus which refers to results of first corrections for a plurality of substrings constituting a code string and performs a second correction according to a combination of degrees of the corrections. In such a case, a second apparatus of the present invention is an apparatus for correcting errors in a product code block including first code strings in a first direction and second code strings in a second direction. The apparatus includes: a first decoder which corrects errors in each of a plurality of substrings constituting the first code string; and a second decoder which corrects the second code string according to a combination of correction degrees in the plurality of substrings.

Moreover, the present invention can also be seen as a method for referring to results of corrections for a plurality of substrings constituting a code string and determining whether or not the corrections are error corrections according to a combination of degrees of the corrections. In such a case, a method of the present invention is a method for recognizing errors in a product code block including first code strings in a first direction and second code strings in a second direction. The method includes the steps of: correcting errors in a plurality of substrings constituting the first code string; storing correction degrees in the plurality of substrings; and determining whether or not the first code string is erroneously corrected, when the correction degree stored for one of the plurality of substrings is not lower than a predetermined level, by referring to the correction degrees stored for the other substrings.

Here, it is also possible to perform erasure correction for a row determined as being erroneously corrected. Specifically, the method of the present invention can further include the step of: correcting the second code string after a position of the first code string is set as an erasure position in the case where the first code string is determined as being erroneously corrected.

Meanwhile, the present invention can also be seen as a program for allowing a computer to implement predetermined functions. In such a case, a program of the present invention is a program for allowing a computer to recognize errors in a product code block including first code strings in a first direction and second code strings in a second direction. The program allows the computer to execute the processes of: correcting errors in a plurality of substrings constituting the first code string; and determining whether or not the first code string is erroneously corrected, when a correction degree in one of the plurality of substrings is not lower than a predetermined level, by referring to correction degrees in the other substrings.

According to the present invention, it is possible to prevent an increase of the probability of erroneous correction for a burst error having a length exceeding detection capability even if high correction capability is selected for a random error.

FIG. 1 is a view showing a configuration of a tape drive 10 to which this embodiment is applied. This tape drive 10 includes a roll of magnetic tape 13 wound around reels 11 and 12, a head 14, a read channel 15, an SRAM buffer 16, a C1 decoder 17, a DRAM buffer 18, an SRAM buffer 19, a C2 decoder 20 and a host I/F (interface) 21.

The reels 11 and 12 are driven by an unillustrated motor and enable the magnetic tape 13 suspended therebetween to be moved relative to the head 14.

The head 14 is a mechanism for writing data onto the magnetic tape 13 and for reading the data from the magnetic tape 13. Note that, for convenience of drawing figures, only one head 14 is shown in the figure. However, for example, the first generation or second generation LTO tape drive includes eight write heads and eight read heads.

The read channel 15 sends the data read by the head 14 to the SRAM buffer 16. The SRAM buffer 16 is a buffer memory for temporarily storing the received data. The C1 decoder 17 performs C1 correction for the data stored in the SRAM buffer 16. The DRAM buffer 18 is a memory buffer for storing the data transferred from the SRAM buffer 16 as sub data sets to be described later.

The SRAM buffer 19 is a buffer memory which retrieves a part of the data stored in the DRAM buffer 18 and temporarily stores the data for C2 correction. The C2 decoder 20 performs the C2 correction for the data stored in the SRAM buffer 19. The host I/F 21 transmits the data subjected to the C1 correction and the C2 correction to a host machine.

Figure 2:
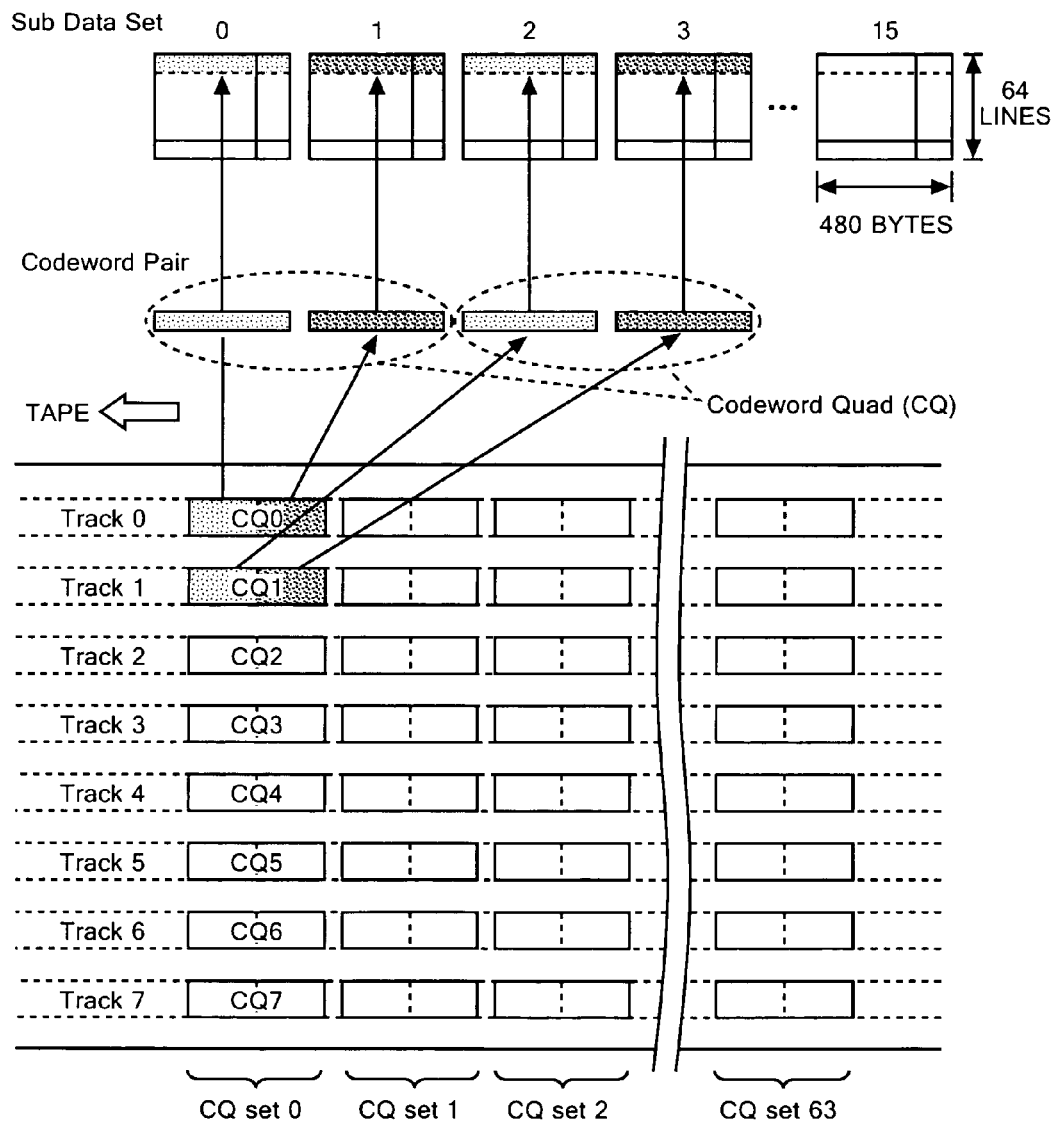
FIG. 2 is a view for explaining how data is read from a magnetic tape in the embodiment of the present invention.

Next, operations of the tape drive 10 in this embodiment will be described. First, description will be given of a processing flow from reading data from the magnetic tape 13 to storing the data in the DRAM buffer 18. FIG. 2 shows a tape format of the second generation or first generation LTO tape drive. In this format, CQs (Codeword Quads) 0 to 7 are recorded on tracks 0 to 7, which correspond to heads 0 to 7, on the tape. The CQs 0 to 7 constitute CQ set 0. Similarly, CQ sets 1 to 63 are also recorded. Each of the CQs 0 to 7 is divided into a first half and a second half. Moreover, a first half of a CQi is set to be a first line of a sub data set 2i, and a second half of the CQi is set to be a first line of a sub data set (2i+1) (i=0, 1, ..., 7). This is repeated to the CQ set 63. Specifically, by setting predetermined data obtained from a CQ set n to be an nth line of a sub data set, 16 sub data sets, each including 64 lines, are formed.

Figure 3:
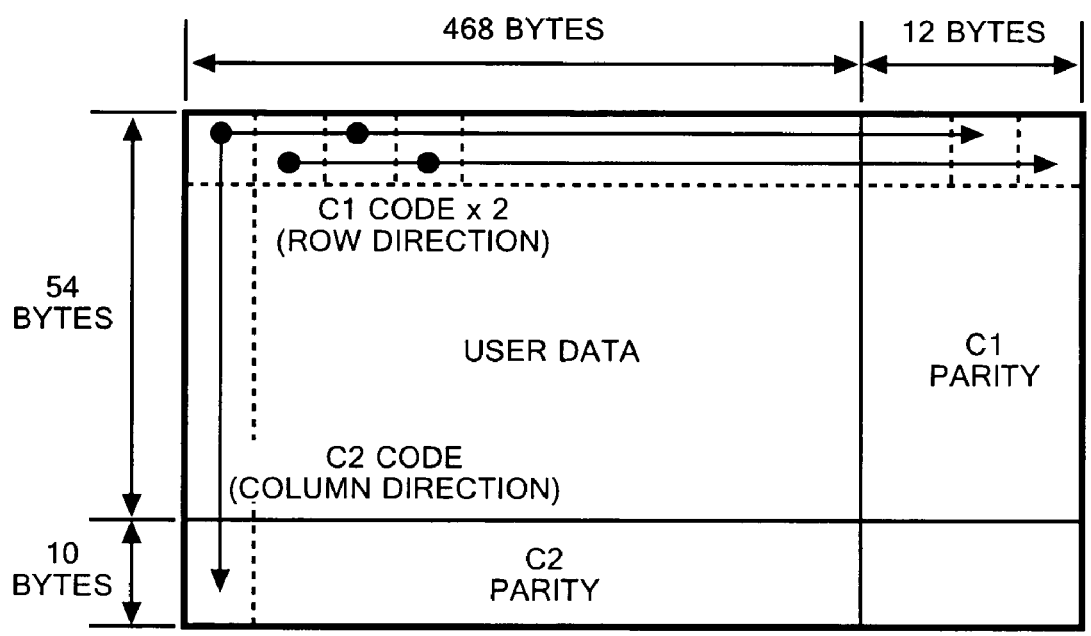
FIG. 3 is a view for explaining a structure of a sub data set in the embodiment of the present invention.

Here, with reference to FIG. 3, a configuration of each of the sub data sets will be described. In the LTO tape drive, an error correction is performed by using the sub data set as a unit. Specifically, an error correction code in this case is a product code including C1 codes in a row direction and C2 codes in a column direction. Note that the characteristics of the LTO format include the point that there are two kinds of C1 codes: a code including even-numbered bytes (hereinafter referred to as an "even C1"); and a code including odd-numbered bytes (hereinafter referred to as an "odd C1").

To be more specific, since the sub data set has 480 bytes in the row direction, the C1 code is divided into the even C1 of 240 bytes and the odd C1 of 240 bytes. Moreover, the respective C1 codes include C1 parities. The C1 parity has 12 bytes when a parity of the even C1 and a parity of the odd C1 are added up. Thus, each of the parities has 6 bytes. Specifically, the C1 correction is performed for the even C1 by use of the C1 parity of 6 bytes including the even-numbered bytes, and the C1 correction is performed for the odd C1 by use of the C1 parity of 6 bytes including the odd-numbered bytes. Meanwhile, since the sub data set has 64 bytes in the column direction, the C2 code has 64 bytes. Moreover, the C2 code includes a C2 parity of 10 bytes.

Next, with reference to FIG. 4, operations of the C1 correction will be described in detail. Note that, here, description will be given of processing for the first halves, for example, of the CQs 0 to 7 shown in FIG. 2.

First, the head 14 reads data for eight lines from eight tracks at the same time, and the read channel 15 stores the data in the SRAM buffer 16 (Step 101). Thus, processing of the C1 correction by the C1 decoder 17 is started. In the case of the LTO, as described above, the C1 code includes the even C1 and the odd C1, so that sixteen C1 codes are obtained from the data for eight lines. Accordingly, the C1 decoder 17 calculates syndromes of the sixteen C1 codes (Step 102).

Next, the C1 decoder 17 calculates error positions and values from the syndromes of the C1 codes and corrects the C1 codes stored in the SRAM buffer 16 (Step 103). Thereafter, the C1 decoder 17 determines, in response to the correction, how many bytes of the C1 code are corrected (Step 104). As a result, when no correction is performed or when 1 or 2 bytes are corrected (in the case of "0 to 2-byte correction"), the processing advances directly to Step 107. Meanwhile, when 3 bytes are corrected (in the case of "3-byte correction"), a 3-byte correction flag is added to the C1 code (Step 105). Moreover, when the correction is not completed successfully (in the case of "correction failure"), a correction failure flag is added to the C1 code (Step 106).

Thereafter, the C1 decoder 17 determines whether or not a pair of the even C1 and the odd C1 is processed (Step 107). If the pair is not processed, the processing from Step 103 to Step 106 is repeated. Thus, when each of the even C1 and the odd C1 is determined as the 3-byte correction or the correction failure, the flag indicating the case is added thereto.

Figure 5:
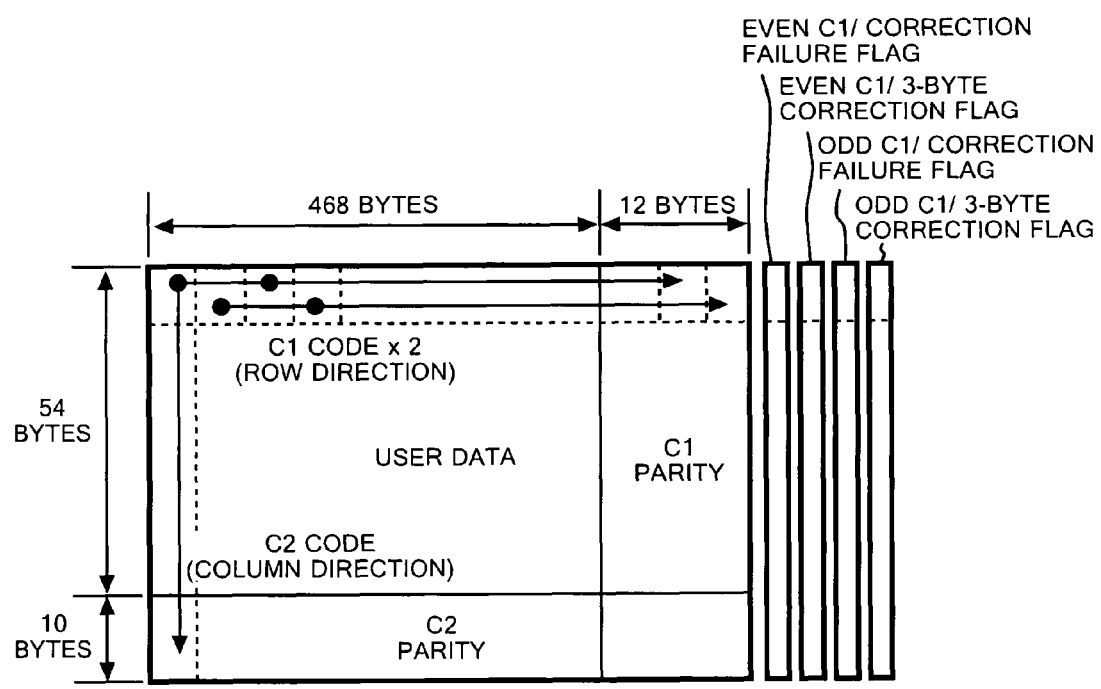
FIG. 5 is a view for explaining addition of flags to the sub data set in the embodiment of the present invention.

Such addition of the flags to the sub data set will be described with reference to FIG. 5. As shown in the figure, the sub data set includes storage regions provided for each row, in which four flags can be added. The four flags are a correction failure flag and a 3-byte correction flag for the even C1 and a correction failure flag and a 3-byte correction flag for the odd C1. Each of the flags has an initial value of "0", for example, and the value is set to "1" when the appropriate flag is added.

Now referring back to FIG. 4, the description of the operations of the C1 correction will be continued. When it is determined in Step 107 that the pair of the even C1 and the odd C1 has been processed, the processed data for one line is transferred to the DRAM buffer 18 from the SRAM buffer 16 (Step 108).

Finally, it is determined whether or not there are unprocessed C1 codes in the SRAM buffer 16 (Step 109). As a result, if there are unprocessed C1 codes, the processing returns to Step 103. On the other hand, if there are no unprocessed C1 codes, the processing is terminated.

Figure 4:
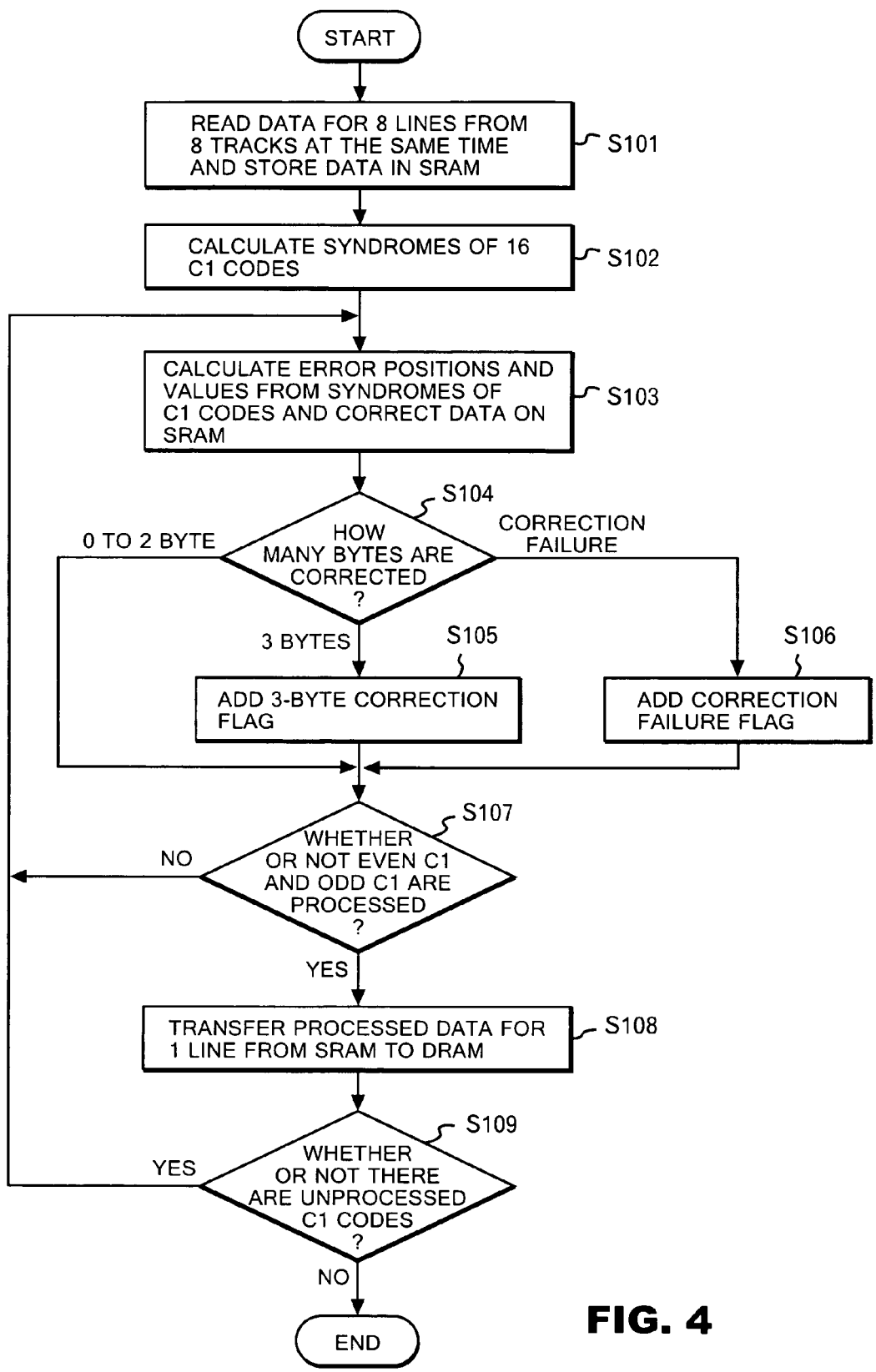
FIG. 4 is a flowchart showing operations of C1 correction in the embodiment of the present invention.

Note that, if the processing shown in FIG. 4 is, as described above, the processing for the first halves of the CQs 0 to 7 shown in FIG. 2, the same processing is carried out for the second halves of the CQs 0 to 7 and the CQ sets 1 to 63. Thus, the sub data sets which have been subjected to the C1 correction and have the flags added thereto according to need are stored in the DRAM buffer 18.

In the C1 correction described above, the even C1 and the odd C1 are corrected separately from each other for each row. Moreover, in the case where a combination of correction results for the even C1 and the odd C1 is one with a high rate of occurrence as a correction result for a burst error, the corrections are determined as being erroneous corrections even if the even C1 and the odd C1 are correctable. Subsequently, erasure correction is carried out in C2 correction to be described below. Thus, an erroneous correction probability for the burst error can be lowered.

FIG. 6 shows correspondence information between the C1 correction results and whether or not to carry out the erasure correction in the C2 correction in this embodiment.

As a matter of course, if either the even C1 or the odd C1 is uncorrectable, the erasure correction is carried out in the C2 correction. In addition, in this embodiment, if one of the even C1 and the odd C1 has been subjected to the 3-byte correction, whether or not to perform the erasure correction in the C2 correction is determined according to the correction result for the other one.

To be more specific, it is considered to be highly likely that the 3-byte correction is an error correction if the other one has been uncorrectable or subjected to the 3-byte correction. Thus, the erasure correction is performed in the C2 correction (shaded portions). On the other hand, even the same 3-byte correction is considered to be unlikely to be the error correction as long as the other one has been subjected to the 0 to 2-byte correction. Thus, subsequent processing is carried out by using the correction result obtained by the 3-byte correction.

Note that, although not included in the correspondence information, rates of occurrence for every combination of the C1 correction results for the burst errors are shown in the right margin of FIG. 6 for reference. Specifically, in this embodiment, the erasure correction is performed in the C2 correction for the combinations having the rate of occurrence of 1% or more among those of the C1 correction results.

Figure 7:
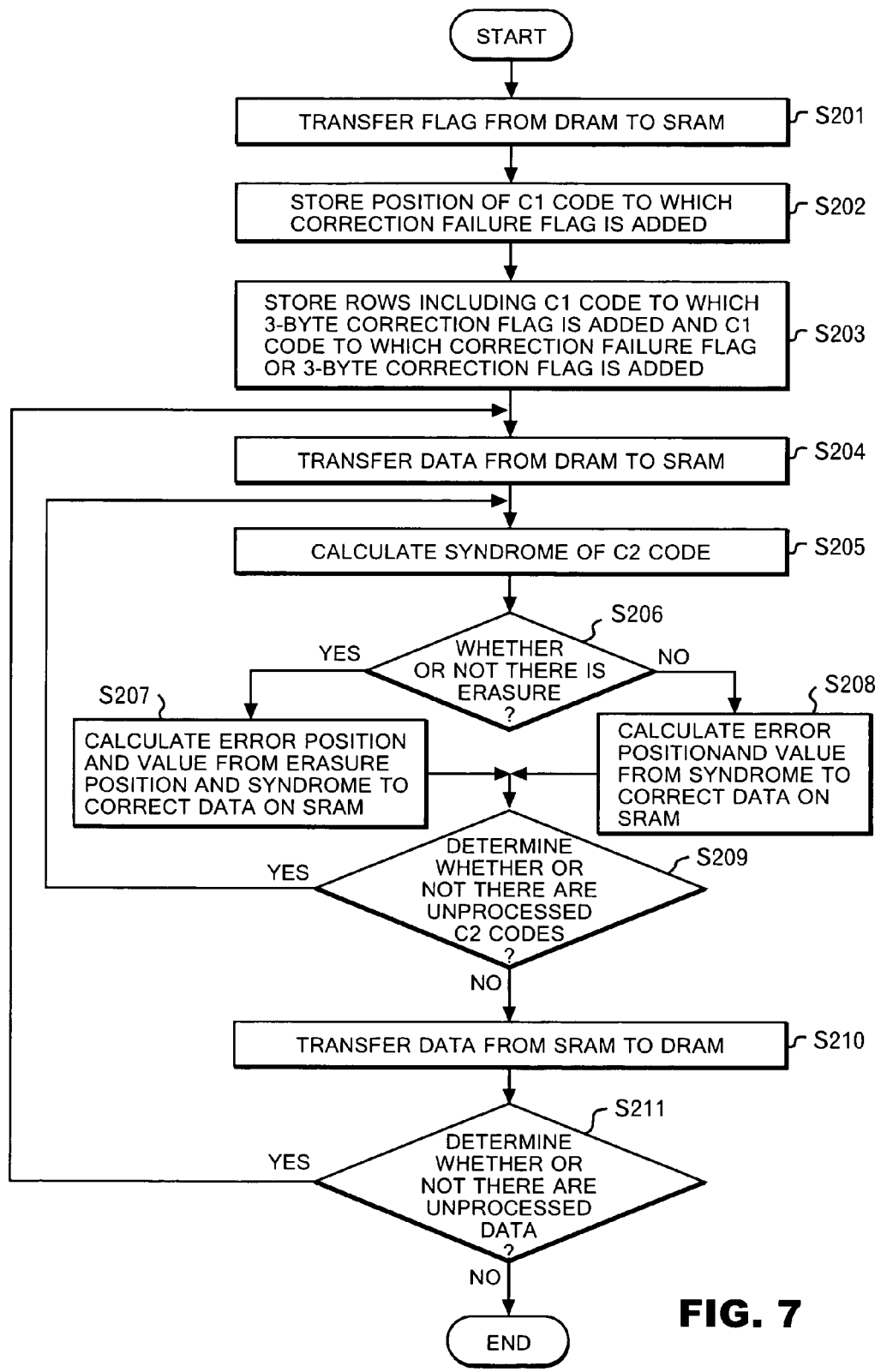
FIG. 7 is a flowchart showing operations of the C2 correction in the embodiment of the present invention.

With reference to FIG. 7, operations of the C2 correction as described above will be described. First, the flag portion of the sub data set shown in FIG. 5 is transferred from the DRAM buffer 18 to the SRAM buffer 19 (Step 201). Accordingly, the C2 decoder 20 stores a position (erasure position) of the C1 code to which the correction failure flag is added (Step 202). Moreover, the C2 decoder 20 also stores positions (erasure positions) of the rows including the C1 code to which the 3-byte correction flag is added and the C1 code to which the correction failure flag or the 3-byte correction flag is added (Step 203).

Next, the data portion of the sub data set is transferred from the DRAM buffer 18 to the SRAM buffer 19 (Step 204). Since the SRAM buffer 19 has a capacity smaller than that of the DRAM buffer 18, the data portion of the sub data set is divided into several columns and transferred to the SRAM buffer 19. Thereafter, the C2 decoder 20 performs processing from Step 205 to Step 209 for every several columns stored in the SRAM buffer 19.

Specifically, first, the C2 decoder 20 calculates a syndrome of a C2 code (Step 205). Moreover, the C2 decoder 20 determines whether or not the erasure position has been stored in Step 202 or Step 203 (Step 206). As a result, when it is determined that the erasure position has been stored, error position and value are calculated from the erasure position and the syndrome to correct the C2 code stored in the SRAM buffer 19 (Step 207). More specifically, an erasure position polynomial is obtained from the erasure position, and the error position and value are calculated from the erasure position polynomial and the syndrome to correct the C2 code. Meanwhile, when it is determined that the erasure position has not been stored, error position and value are calculated from the syndrome to correct the C2 code stored in the SRAM buffer 19 (Step 208).

Specifically, if there is an erasure position, an error correction in consideration of not only a random error but also a burst error is carried out. On the other hand, if there is no erasure position, an error correction in consideration of only a random error is carried out. Note that, although not shown in FIG. 7, if it is determined here that the C2 code is uncorrectable, the C2 code is left uncorrected, and an unillustrated controller of the tape drive 10 is notified of an error. Thereafter, error recovery processing is performed by the tape drive 10 under the control of the controller, and, if the error cannot be recovered, the host machine is notified of an error.

Next, the C2 decoder 20 determines whether or not there are unprocessed C2 codes in the SRAM buffer 19 (Step 209). As a result, if there are unprocessed C2 codes, the processing returns to Step 205. On the other hand, if there are no unprocessed C2 codes, the processed C2 codes are written back from the SRAM buffer 19 to the DRAM buffer 18 (Step 210).

Thereafter, the C2 decoder 20 determines whether or not there are unprocessed C2 codes in the DRAM buffer 18 (Step 211). As a result, if there are unprocessed C2 codes, the processing returns to Step 204. On the other hand, if there are no unprocessed C2 codes, the processing is terminated. Finally, the data in the DRAM buffer 18 is transmitted to the host machine through the host I/F 21.

Note that, in this embodiment, the C1 correction is performed for the C1 codes in the row direction, and, thereafter, the C2 correction is performed for the C2 codes in the column direction. However, the present invention is not limited to such a configuration. Specifically, code strings to be subjected to first correction and code strings to be subjected to second correction do not always have to be in the row and column directions but may be in any directions.

Moreover, in this embodiment, a minimum Hamming distance dmin=7 is set as a precondition. Thus, the "0 to 2-byte correction", the "3-byte correction" and the "correction failure" are considered as the correction results, and the operations are performed according to the correspondence relationship as shown in FIG. 6. However, the present invention is not limited thereto. Specifically, it is also possible to perceive that the correction of a predetermined level or more is seen as an error correction if a degree of correction for a pair of code strings is the predetermined level or more or if the correction thereof is impossible.

Furthermore, in this embodiment, one of the code strings is divided into two substrings based on even-numbered bytes and odd-numbered bytes, and the first correction is performed for the respective substrings. However, it is not necessarily required to divide the code string into the two substrings based on the even-numbered bytes and the odd-numbered bytes. Moreover, the number of the substrings is not limited to 2. Specifically, it is also possible to adopt a configuration in which one code string is divided into a plurality of substrings, in which the first correction is performed for the plurality of substrings, respectively, and in which the second correction is performed according to combinations of correction results.

As described above, in this embodiment, whether or not the corrections are error corrections is determined by referring to the correction results for the pair of two C1s. Moreover, for the row including the error correction in response to the determination result, the erasure correction is performed in the C2 correction. Thus, it is possible to prevent an increase of the probability of erroneous correction for burst errors even if high correction capability is selected for random errors.

FIGS. 8 (a) and 8 (b) are graphs showing a relationship between a rate of occurrence of burst errors and an erroneous correction probability in the C2 correction. FIG. 8 (a) shows the case where the conventional method is adopted. It is found out from this graph that the probability of causing the error correction in the C2 correction is higher when the 3-byte correction is performed than when the 2-byte correction is performed in the C1 correction.

Meanwhile, FIG. 8 (b) shows the case where the method of the present invention is adopted. It is found out that, although the erroneous correction probability in the case of the 3-byte correction is slightly higher than that in the case of the 2-byte correction in the C1 correction, these probabilities are approximately the same.

Figure 9:
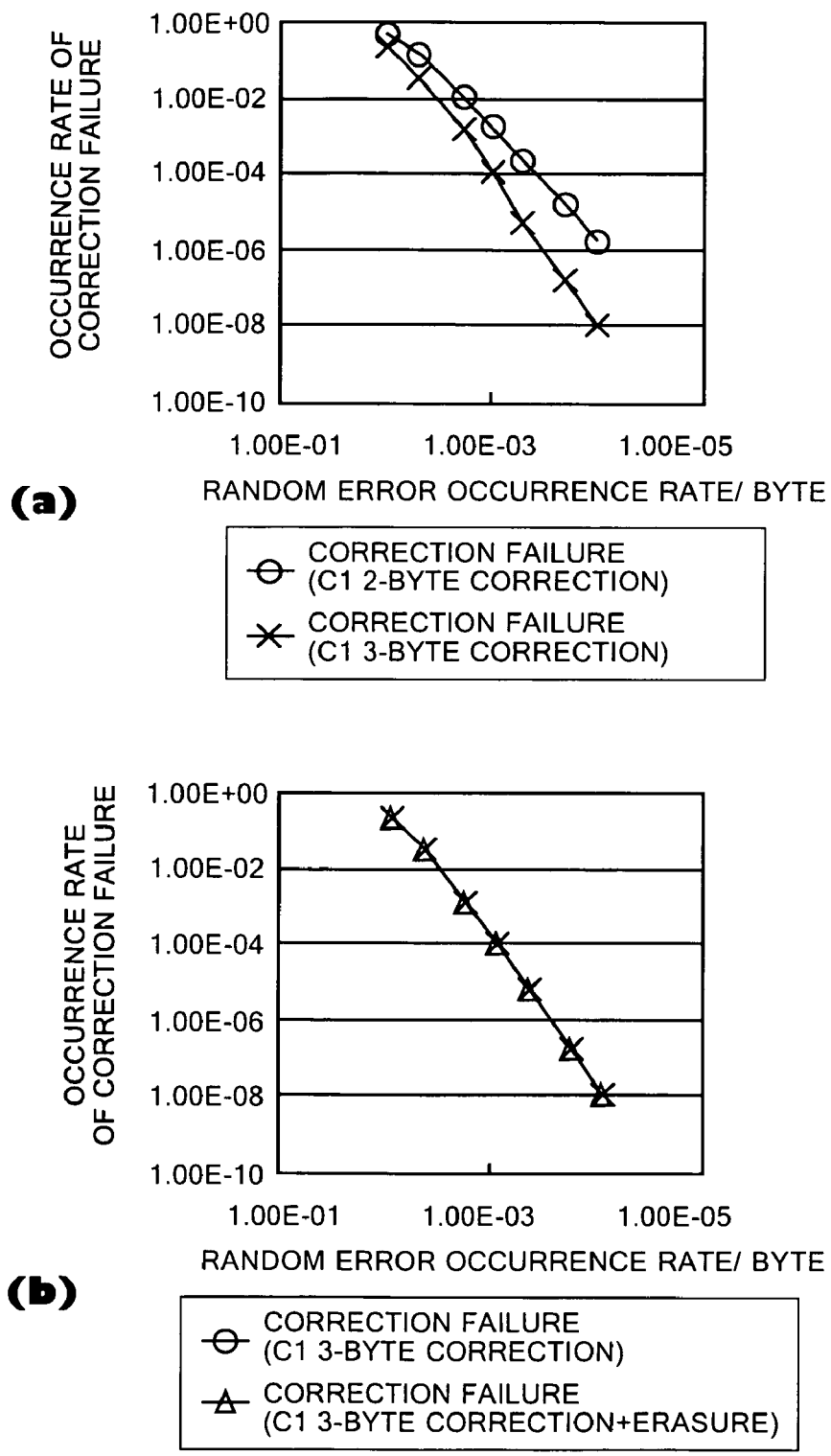
FIGS. 9 (a) and 9 (b) are graphs showing that the embodiment of the present invention has no influence on a probability of occurrence of uncorrectable random errors.

Moreover, FIGS. 9 (a) and 9 (b) are graphs showing a relationship between a rate of occurrence of random errors and a rate of occurrence of correction failure. FIG. 9(a) shows that the probability of causing the correction failure is lowered when the 3-byte correction is performed than when the 2-byte correction is performed.

Meanwhile, FIG. 9 (b) shows that, even if the 3-byte correction is subjected to erasure correction under certain conditions as in the case of the present invention, the effect of reducing the rate of occurrence of correction failure for random errors is the same.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, or use of equivalent functional steps for steps described herein. Such insubstantial variations are to be considered within the scope of what is contemplated here. Moreover, if plural examples are given for specific means, or steps, and extrapolation between or beyond such given examples is obvious in view of the present disclosure, then the disclosure is to be deemed as effectively disclosing and thus covering at least such extrapolations.

Unless expressly stated otherwise herein, ordinary terms have their corresponding ordinary meanings within the respective contexts of their presentations, and ordinary terms of art have their corresponding regular meanings.

What is claimed is:

1. An apparatus for correcting errors in a product code block including a first byte string in a first direction and a second byte string in a second direction, comprising:
   a first decoder which corrects an error in each of a first substring including even-numbered bytes in the first byte string, and a second substring including odd-numbered bytes in the first byte string; and
   a second decoder which corrects the second byte string according to a combination of a first degree of correction in the first substring and a second degree of correction in the second substring, and wherein the second decoder determines whether or not the first code string is erroneously corrected when the first degree of correction is not lower than a predetermined level.

2. The apparatus according to claim 1, wherein the second decoder corrects the second byte string after a position of the first byte string is set as an erasure position when one of the first degree and the second degree is not lower than a predetermined level, and the other one is correction failure.

3. The apparatus according to claim 2, wherein a minimum Hamming distance of the first byte string is 7 and the predetermined level is 3-byte correction.

4. The apparatus according to claim 1, wherein the second decoder corrects the second byte string after a position of the first byte string is set as an erasure position when one of the first degree and the second degree is not lower than a first level, and the other one is not lower than a second level.

5. The apparatus according to claim 4, wherein a minimum Hamming distance of the first byte string is 7 and both of the first and second levels are a 3-byte correction.

6. The apparatus according to claim 1, further comprising:
   a head for reading data recorded on a tape medium; and
   a read channel for generating the product code block by arranging the data read by the head at predetermined positions on a memory.

7. An apparatus for correcting errors in a product code block including a first code string in a first direction and a second code string in a second direction, comprising:
   a first decoder which corrects errors in each of a plurality of substrings comprising the first code string; and
   a second decoder which corrects the second code string according to a combination of correction degrees in the plurality of substrings and wherein the second decoder determines whether or not the first code string is erroneously corrected.

8. The apparatus according to claim 7, wherein the second decoder corrects the second code string after a position of the first code string is set as an erasure position when the correction degree in one of the plurality of substrings is not lower than a predetermined level, and the correction degrees in the other substrings are a correction failure.

9. The apparatus according to claim 7, wherein the second decoder corrects the second code string after a position of the first code string is set as an erasure position when the correction degree in one of the plurality of substrings is not lower than a predetermined level, and the correction degrees in the other substrings are not lower than the predetermined level.

10. The apparatus according to claim 7, wherein each of the plurality of substrings is formed by combining selected portions of the first code string.

11. A method for recognizing erroneous corrections in a product code block including a first code string in a first direction and a second code string in a second direction, comprising the steps of:
   reading with a head from a recording medium data corresponding to the first code string and the second code string;
   storing the data corresponding to the first code string and the second code strong into a buffer memory;
   correcting errors in each of a plurality of substrings constituting the first code string;
   storing correction degrees in the plurality of substrings; and
   determining whether or not the first code string is erroneously corrected, when the correction degree stored for one of the plurality of substrings is not lower than a predetermined level, a determination referring to the correction degrees stored for the other substrings.

12. The method according to claim 11, wherein in the determination step the first code string is determined as being erroneously corrected when the correction degrees stored for the other substrings are correction failure.

13. The method according to claim 11, wherein in the determination step the first code string is determined as being erroneously corrected when the correction degrees stored for the other substrings are not lower than the predetermined level.

14. The method according to claim 11, wherein each of the plurality of substrings is formed by combining selected portions of the first code string.

15. The method according to claim 11, further comprising the step of correcting the second code string after a position of the first code string is set as an erasure position when the first code string is determined as being erroneously corrected.

16. A computer-program product for use with a computer system for recognizing errors in a product code block including a first code string in a first direction and a second code string in a second direction, the computer-program product comprising:
   a non-transitory computer-readable medium;
   means, provided on the computer-readable medium, for correcting errors in each of a plurality of substrings constituting the first code string; and
   means, provided on the computer-readable medium, for determining whether or not the first code string is erroneously corrected, when a correction degree in one of the plurality of substrings is not lower than a predetermined level, the determination made by referring to correction degrees in the other substrings.

17. The computer-program product according to claim 16, further comprising means, provided on the computer-readable medium, for determining that the first code string is erroneously corrected when the correction degrees in the other substrings are correction failures.

18. The computer-program product according to claim 16, further comprising means, provided on the computer-readable medium, for determining that the first code string is erroneously corrected when the correction degrees in the other substrings are not lower than the predetermined level.

19. The computer-program product according to claim 16, further comprising means, provided on the computer-readable medium, for forming each of the plurality of substrings by combining selected portions of the first code string.

20. The computer-program product according to claim 16, further comprising means, provided on the computer-readable medium, for correcting the second code string after a position of the first code string is set as an erasure position when the first code string is determined as being erroneously corrected.

* * * * *